United States Patent
Min

(10) Patent No.: US 9,185,796 B2
(45) Date of Patent: Nov. 10, 2015

(54) ORGANIC LIGHT EMITTING DIODE DISPLAY AND MANUFACURING METHOD THEREOF

(71) Applicant: Samsung Display Co., Ltd., Yongin (KR)

(72) Inventor: Kyoung-Wook Min, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/248,095

(22) Filed: Apr. 8, 2014

(65) Prior Publication Data

US 2015/0069340 A1 Mar. 12, 2015

(30) Foreign Application Priority Data

Sep. 11, 2013 (KR) .................. 10-2013-0109284

(51) Int. Cl.
| | |
|---|---|
| H01L 21/66 | (2006.01) |
| H01L 35/24 | (2006.01) |
| G01R 31/26 | (2014.01) |
| H05K 1/02 | (2006.01) |
| H05K 3/46 | (2006.01) |
| H01L 27/32 | (2006.01) |
| H01L 51/52 | (2006.01) |
| H01L 51/56 | (2006.01) |
| H01L 51/50 | (2006.01) |

(52) U.S. Cl.
CPC .............. *H05K 1/0268* (2013.01); *H01L 22/34* (2013.01); *H01L 27/3223* (2013.01); *H05K 3/4638* (2013.01); *H01L 27/3246* (2013.01); *H01L 51/5012* (2013.01); *H01L 51/5056* (2013.01); *H01L 51/5072* (2013.01); *H01L 51/5221* (2013.01); *H01L 51/5237* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 6,391,669 B1 * | 5/2002 | Fasano et al. ................ | 438/18 |
| 2004/0196056 A1 * | 10/2004 | Kronrod ....................... | 324/716 |
| 2011/0101857 A1 * | 5/2011 | Kanatani et al. ............. | 313/504 |
| 2011/0134383 A1 | 6/2011 | Okada et al. | |
| 2011/0233604 A1 * | 9/2011 | Ikeda ........................... | 257/103 |

FOREIGN PATENT DOCUMENTS

| | | |
|---|---|---|
| JP | 2011-216268 | 10/2011 |
| KR | 10-2006-0061662 | 6/2006 |
| KR | 10-1183409 | 9/2012 |

* cited by examiner

*Primary Examiner* — Calvin Choi
*Assistant Examiner* — Xiaoming Liu
(74) *Attorney, Agent, or Firm* — H.C. Park & Associates, PLC

(57) ABSTRACT

An OLED display including a substrate having a pixel area where an organic light emitting diode is formed, and a peripheral area surrounding the pixel area. Monitoring patterns are disposed in the peripheral area and are separated from each other.

19 Claims, 8 Drawing Sheets

ORGANIC LIGHT EMITTING DIODE DISPLAY AND MANUFACURING METHOD THEREOF

CROSS-REFERENCE TO RELATED APPLICATION

This application claims priority from and the benefit of Korean Patent Application No. 10-2013-0109284, filed on Sep. 11, 2013, which is hereby incorporated by reference for all purposes as if fully set forth herein.

BACKGROUND OF THE INVENTION

1. Field

Exemplary embodiments of the present invention relate to an organic light emitting diode (OLED) display and a manufacturing method thereof.

2. Discussion of the Background

An organic light emitting diode (OLED) display includes two electrodes and an organic emission layer disposed between them, and electrons injected from one electrode and holes injected from the other electrode are combined in the organic emission layer to generate excitons and light emission is performed while the excitons discharge energy.

In order to apply such an OLED display to a large-sized display such as a TV, the size of the OLED display has been increased, but a large-sized fine metal mask (FMM) for the enlargement of the OLED display cannot be easily manufactured when a thin film is formed through a vacuum deposition process using an FMM. Thus, a method for printing by liquidizing an OLED material has been proposed for application to size-enlargement of the OLED display.

A general printing method includes slit coating, inkjet printing, nozzle printing, and the like. In determining the thickness and a profile of the surface of a thin film using such a printing method, a complex shape of the surface of the thin film in which layers are stacked cannot be easily analyzed, so that discharge amount control in the printing apparatus has been monitored using a weight measuring method, a thin film thickness measuring method, a vision measuring method, a transmittance measuring method, and the like. However, the weight measuring method, the vision measuring method, and the transmittance measuring method cannot acquire information on a unit layer printed to an OLED panel.

In addition, in case of ellipsometry, which is a thin film thickness measuring method used in a vacuum deposition process, a beam size appropriate for the thickness of an organic layer is a unit of millimeters, and therefore, it is not easy to measure a film thickness in a pixel of tens to hundreds of micrometers or to measure a surface profile. Therefore, in order to acquire information about a unit layer, a monitoring pattern area of several millimeters is required at an outer edge of a substrate, and the thickness cannot be determined in real time as a result of a vacuum process so that, if a failure occurs, it may take an undesirably long period of time to address the failure.

The above information disclosed in this Background section is only for enhancement of understanding of the background of the invention and, therefore, it may contain information that does not constitute prior art.

SUMMARY

Exemplary embodiments of the present invention provide an organic light emitting diode (OLED) display that can promptly determine the thickness and profile of each of thin films, and a manufacturing method thereof.

Additional aspects will be set forth in part in the description which follows and, in part will be apparent from the description, or may be learned by practice of the invention.

An exemplary embodiment of the present invention discloses an OLED display including a substrate having a pixel area in which an organic light emitting diode is formed, and a peripheral area surrounding the pixel area, and monitoring patterns formed in the peripheral area and separated from each other.

An exemplary embodiment of the present invention also discloses a method for manufacturing an OLED display. The method may include forming an organic light emitting diode and monitoring patterns in a pixel area of a substrate and a peripheral area surrounding the pixel area, and measuring the thickness of each of organic thin films forming an organic light emitting member of the organic light emitting diode by comparing the monitoring patterns with one another.

It is to be understood that both the foregoing general description and the following detailed description are exemplary and explanatory and intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
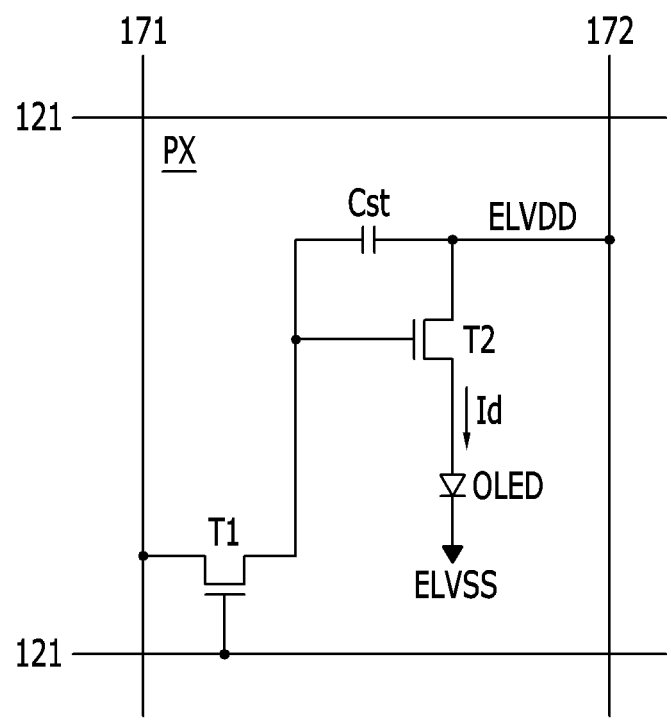
FIG. 1 is an equivalent circuit diagram of an OLED display according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of elements may be exaggerated for clarity. Like reference numerals in the drawings denote like elements.

Accordingly, the drawings and description are to be regarded as illustrative in nature and not restrictive. The size and thickness of the components shown in the drawings are optionally determined for better understanding and ease of description, and the present invention is not limited to the examples shown in the drawings.

In the drawings, the thickness of layers, films, panels, regions, etc., are exaggerated for clarity. In addition, in the drawings, for better understanding and ease of description, the thickness of some layers and areas is exaggerated. It will be understood that when an element such as a layer, film, region, or substrate is referred to as being "on" another element, it can be directly on the other element, or intervening elements may also be present. In contrast, when an element is referred to as being "directly on," "directly connected to", or "directly coupled to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

In addition, the accompanying drawings illustrate an active matrix (AM) type of organic light emitting diode (OLED) display having a 6Tr-2Cap structure, in which each pixel is provided with 6 thin film transistors TFTs and two capacitors, but the present invention is not limited thereto. Thus, the OLED display may have various structures. For example, each pixel of the OLED display may be provide with a plurality of thin film transistors and one or more capacitors, and additional wires may be further formed or an existing wire may be omitted. At a minimum, a "pixel" means a unit which displays an image, and the organic light emitting diode display displays an image through a plurality of pixels.

FIG. 1 is an equivalent circuit diagram of an organic light emitting diode (OLED) display according to an exemplary embodiment of the present invention. In FIG. 1, an OLED display includes signal lines 121, 171, and 172, and pixels connected to the signal lines and arranged in a matrix.

The signal lines include scan lines 121 for transmitting a gate signal (or a scan signal), data lines 171 for transmitting a data signal, and driving voltage lines 172 for transmitting a driving voltage. The scan lines 121 extend in a row direction and are substantially parallel with each other. The data lines 171 and the driving voltage lines 172 extend in a column direction and are substantially parallel with each other.

Each pixel PX includes a switching thin film transistor T1, a driving thin film transistor T2, a storage capacitor Cst, and an organic light emitting diode OLED.

The switching thin film transistor T1 includes a control terminal connected to the scan line 121, an input terminal connected to the data line 171, and an output terminal connected to the driving thin film transistor T2. The switching thin film transistor T1 transmits a data signal applied to the data line 171 to the driving thin film transistor T2 in response to a scan signal applied to the scan line 121.

The driving thin film transistor T2 includes a control terminal connected to the switching thin film transistor T1, an input terminal connected to the driving voltage line 172, and an output terminal connected to the organic light emitting diode LD. The driving thin film transistor T2 transmits an output current Id, whose magnitude varies according to a voltage applied between the control terminal and the output terminal of driving thin film transistor T2.

The storage capacitor Cst is connected between the control terminal and the input terminal of the driving thin film transistor T2. The storage capacitor Cst is charged with a data signal applied to the control terminal of the driving thin film transistor T2, and maintains charging of the data signal after the switching thin film transistor T1 is turned off.

The organic light emitting diode OLED includes an anode connected to the output terminal of the driving thin film transistor T2, a cathode connected to a common voltage ELVDD, and an organic light emitting member formed between the anode and the cathode. The organic light emitting diode OLED displays an image by emitting light with different intensity according to the output current Id of the driving thin film transistor T2.

The switching thin film transistor T1 and the driving thin film transistor T2 may be n-channel field effect transistors (FETs) or p-channel FETs. In addition, a connection relationship between the thin film transistors T1 and T2, the storage capacitor Cst, and the organic light emitting diode OLED can be changed.

A structure of the OLED display according to the exemplary embodiment of the present invention will be described in further detail with reference to FIG. 1 and FIG. 2.

Figure 2:
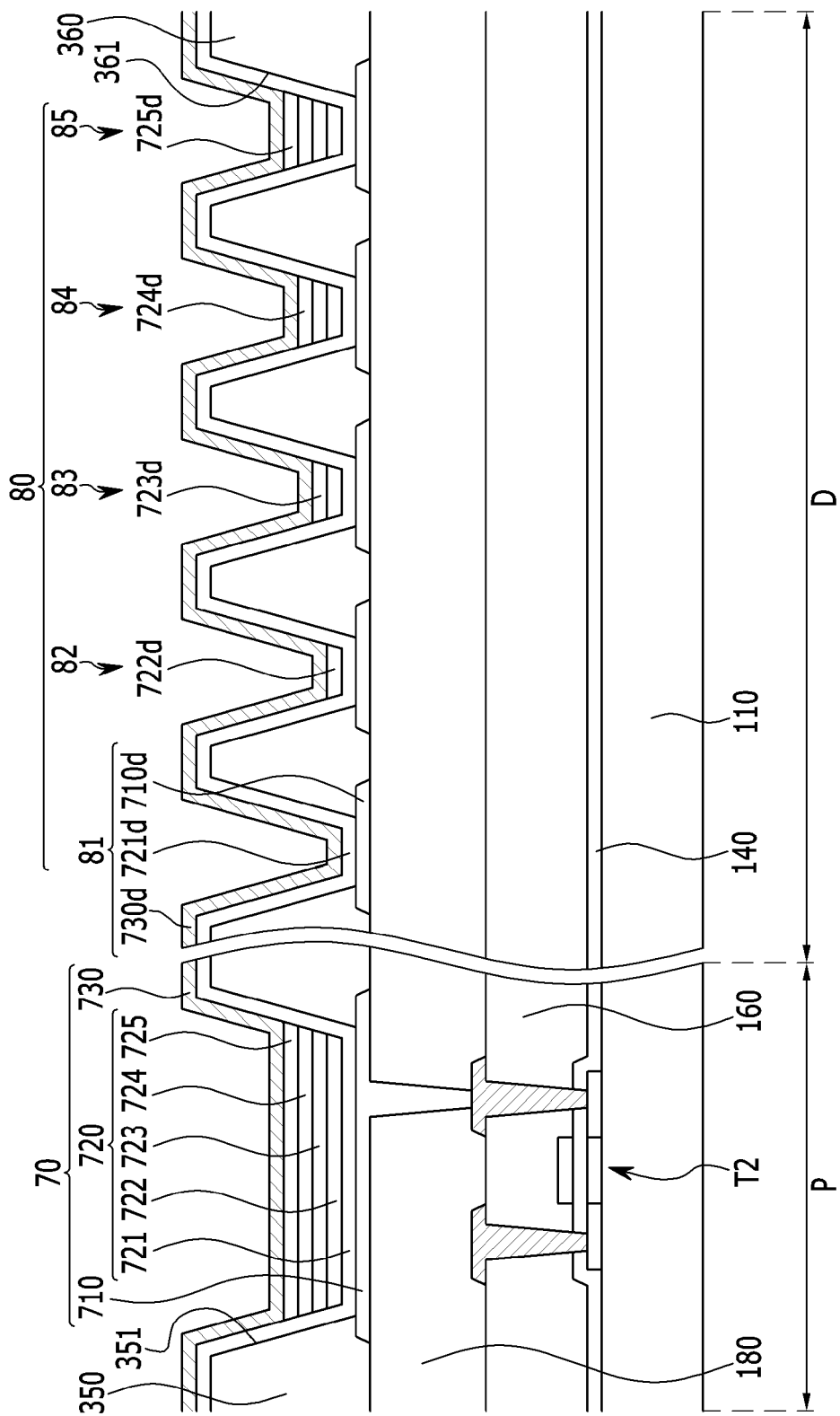
FIG. 2 is a cross-sectional view of the OLED display according to an exemplary embodiment of the present invention.

As shown in FIG. 2, a substrate of the OLED display includes a pixel area P, where light emission occurs, and a peripheral area D surrounding the pixel area P.

The driving thin film transistor T2, which is a switching element, is formed in the pixel area P of the substrate 110. A gate insulating layer 140 covers the substrate 110 and the driving thin film transistor T2. An interlayer insulating layer 160 and a passivation layer 180 cover the gate insulating layer 140, in that order.

An organic light emitting diode 70 is formed in the pixel area P, and monitoring patterns 80 that are separated from each other are formed in the peripheral area D. The organic light emitting diode 70 emits light, and the monitoring patterns 80 do not emit light.

The organic light emitting diode 70 includes a first electrode 710 connected to the driving thin film transistor T2, an organic light emitting member 720 disposed on the first electrode 710, and a second electrode 730 disposed on the organic light emitting member 720.

The first electrode 710 may be formed of a transparent conductor, such as ITO or IZO, and a pixel defining layer 350 formed of an organic layer is formed on the first electrode 710. The pixel defining layer 350 includes an opening that exposes most of the first electrode 710.

The organic light emitting member 720 formed on the first electrode 710 and the pixel defining layer 350 includes layered organic thin films, including lower organic thin films 721 and 722, a middle organic thin film 723, and upper organic thin films 724 and 725. The middle organic thin film 723 may include an organic emissive layer 723 emitting light, the lower organic thin films 721 and 722 may include a hole injection layer (HIL) 721 and a hole transport layer (HTL) 722 that improve emission efficiency, and the upper organic thin films 724 and 725 may include an electron transport layer (ETL) 724 and an electron injection layer (EIL) 725 that improve emission efficiency.

In this case, the hole injection layer 721 may be entirely disposed on the first electrode 710 and the pixel defining layer 350, and the hole transport layer 722, the organic emissive layer 723, the electron transport layer 724, and the electron injection layer 725 may be disposed in an opening 351 of the pixel defining layer 350 using a printing method.

The organic light emitting member 720 of the OLED display may include the hole injection layer 721, the hole transport layer 722, the organic emissive layer 723, the electron transport layer 724, and the electron injection layer 725, but one of the hole injection layer 721, the hole transport layer 722, the electron transport layer 724, and the electron injection layer 725 may be omitted.

The second electrode 730 is disposed on the electron injection layer EIL 725 of the organic light emitting member 720. The second electrode 730 is formed throughout the substrate, and is paired with the first electrode 710 and thus, transmits a current to the organic light emitting member 720.

The first electrode 710, the organic light emitting member 720, and the second electrode 730 form the organic light emitting diode 70. The first electrode 710 may be an anode and the second electrode 730 may be a cathode, or the first electrode 710 may be a cathode and the second electrode 730 may be an anode.

The monitoring patterns 80 may include monitoring organic thin films 721d, 722d, 723d, 724d, and 725d that are made of the same material of at least one of the organic thin films 721, 722, 723, 724, and 725. The monitoring organic thin films 721d, 722d, 723d, 724d, and 725d include lower monitoring organic thin films 721d and 722d, a middle monitoring organic thin film 723d, and upper monitoring organic thin films 724d and 725d. In this case, the lower monitoring organic thin films 721d and 722d include sub-lower monitoring organic thin films, and the upper monitoring organic thin films 724d and 725d include sub-upper monitoring organic thin films. The sub-lower monitoring organic thin films of the OLED display according to the exemplary embodiment include a first sub-lower monitoring organic thin film 721d and a second sub-lower monitoring organic thin film 722d, and the sub-upper monitoring organic thin films include a first sub-upper monitoring organic thin film 724d and a second sub-upper monitoring organic thin film 725d.

The lower monitoring organic thin films 721d and 722d are made of the same material as the lower organic thin films 721 and 722, the middle monitoring organic thin film 723d is made of the same material as the middle organic thin film 723, and the upper monitoring organic thin films 724d and 725d are made of the same material as the upper organic thin films 724 and 725.

The first sub-lower monitoring organic thin film 721d is made of the same material as the hole injection layer 721 and is disposed on the same layer as the hole injection layer 721. The second sub-lower monitoring organic thin film 722d is made of the same material as the hole transport layer 722 and is disposed on the same layer as the hole transport layer 722. The middle monitoring organic thin film 723d is made of the same material as the organic emissive layer 723 and is disposed on the same layer as the organic emissive layer 723. The first sub-upper monitoring organic thin film 724d is made of the same material as the electron transport layer 724 and is disposed on the same layer as the electron transport layer 724. The second sub-upper monitoring organic thin film 725d is made of the same material as the electron injection layer 725 and is disposed on the same layer as the electron injection layer 725.

A peripheral pixel defining layer 360 is made of the same material as the pixel defining layer 350 and is formed on the same layer as the pixel defining layer 350. The peripheral pixel defining layer 360 is formed in the peripheral area D, and the peripheral pixel defining layer 360 separates the monitoring patterns 80.

The monitoring patterns 80 may include lower monitoring patterns 81 and 82, a middle monitoring pattern 83, and upper monitoring patterns 84 and 85. The number of monitoring patterns 80 may be one greater than the number of organic thin films of which the thickness is to be measured. That is, the organic thin films forming the organic light emitting member of the OLED display may be formed of a total of five thin films including the hole injection layer 721, the hole transport layer 722, the organic emission layer 723, the electron transport layer 724, and the electron injection layer 725. However, the hole injection layer 721 may be excluded in the organic thin films of which the thickness can be measured because the hole injection layer 721 is formed over the entire organic light emitting diode 70. Thus, five monitoring patterns 81, 82, 83, 84, and 85 may be formed to measure the thickness of the hole transport layer 722, the organic emission layer 723, the electron transport layer 724, and the electron injection layer 725.

The lower monitoring patterns 81 and 82 include a first lower monitoring pattern 81 and a second lower monitoring pattern 82. The first lower monitoring pattern 81 includes a monitoring electrode 710d made of the same material as the first electrode 710 and on the same layer as the first electrode 710, the first sub-lower monitoring organic thin film 721d formed over the entire peripheral pixel defining layer 360, and a reference monitoring electrode 730d covering the first sub-lower monitoring organic thin film 721d. In addition, the second lower monitoring pattern 82 includes the monitoring electrode 710d, the first sub-lower monitoring organic thin film 721d, the second sub-lower monitoring organic thin film 722d formed in an opening 361 of the peripheral pixel defining layer 360, and the reference monitoring electrode 730d.

The middle monitoring pattern 83 includes the monitoring electrode 710d, the lower monitoring organic thin films 721d and 722d, the middle monitoring organic thin film 723d, and the reference monitoring electrode 730d. The lower monitoring organic thin films 721d and 722d, the middle monitoring organic thin film 723d, and the reference monitoring electrode 730d are sequentially layered.

The upper monitoring patterns 84 and 85 include a first upper monitoring pattern 84 and a second upper monitoring pattern 85, and the first upper monitoring patter 84 includes the monitoring electrode 710d, the lower monitoring organic thin films 721d and 722d, the middle monitoring organic thin film 723d, the first sub-upper monitoring organic thin film 724d, and the reference monitoring electrode 730d. The lower monitoring organic thin films 721d and 722d, the middle monitoring organic thin film 723d, the first sub-upper monitoring organic thin film 724d, and the reference monitoring electrode 730d are sequentially layered. In addition, the second upper monitoring pattern 85 includes the monitoring electrode 710d, the lower monitoring organic thin films 721d and 722d, the middle monitoring organic thin film 723d, the first sub-upper monitoring organic thin film 724d, the second sub-upper monitoring organic thin film 725d, and the reference monitoring electrode 730d. The lower monitoring organic thin films 721d and 722d, the middle monitoring organic thin film 723d, the first sub-upper monitoring organic thin film 724d, the second sub-upper monitoring organic thin film 725d, and the reference monitoring electrode 730d are sequentially layered.

As described above, the organic thin forms 721, 722, 723, 724, and 725 forming the organic light emitting member 720 form the monitoring patterns 80 including at least one of the monitoring organic thin films 721d, 722, 723d, 724d, and 725d that are made of the same materials of the organic thin films 721, 722, 723, 724, and 725 and on the same layer as the organic thin films 721, 722, 723, 724, and 725 such that the thickness and profile of each of the organic thin films 721, 722, 723, 724, and 725 can be precisely determined.

In addition, because the monitoring patterns 80 are formed using the printing method performed in an atmospheric pressure process, the thickness and profile of each of the organic thin films 721, 722, 723, 724, and 725 can be promptly determined.

A manufacturing method of the OLED display according to the exemplary embodiment of the present invention will now be described in further detail with reference to FIG. 3 to FIG. 7.

Figure 3:
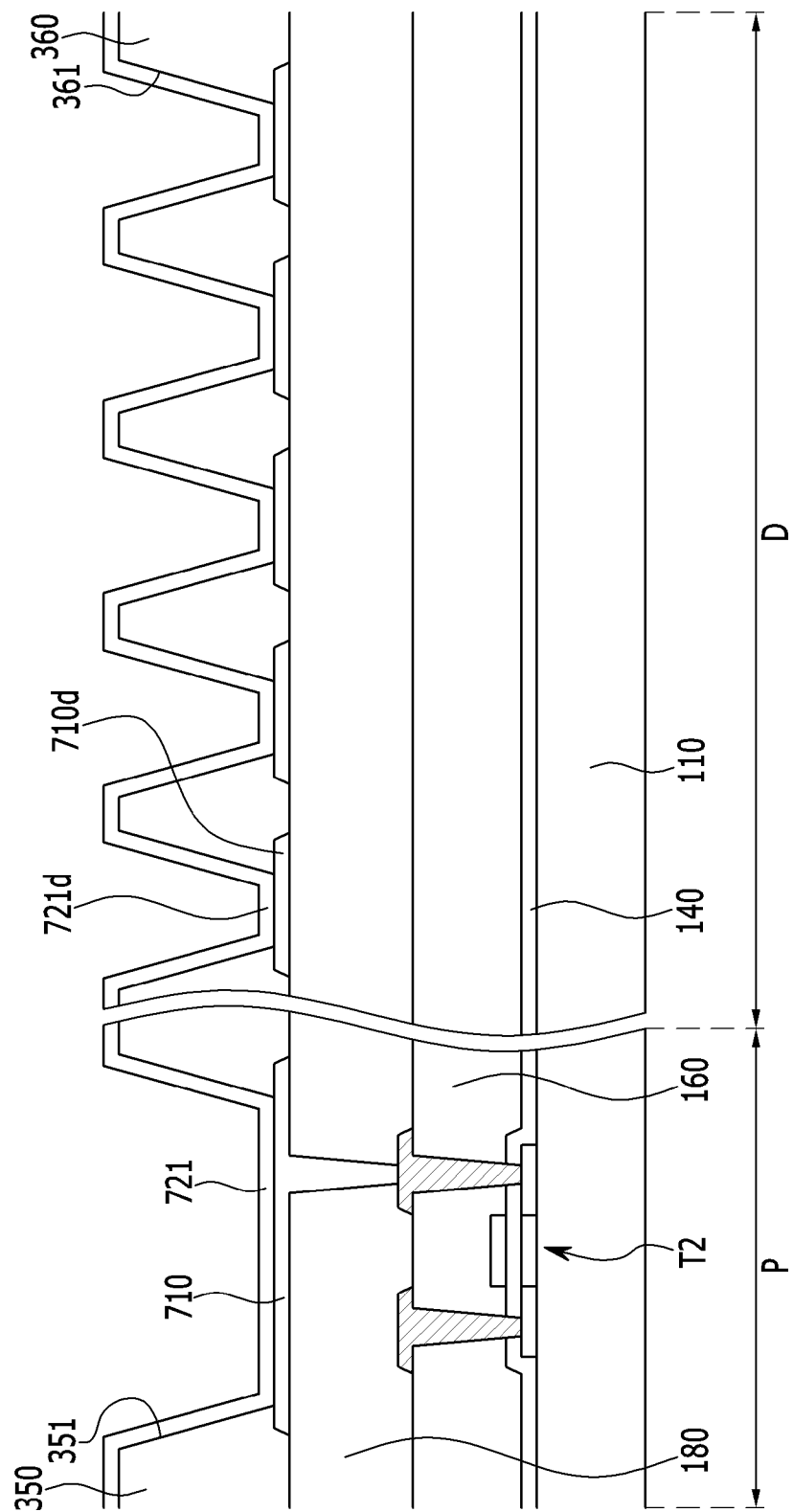
FIG. 3 to FIG. 7 are cross-sectional views of a manufacturing process of the OLED display according to an exemplary embodiment of the present invention.

As shown in FIG. 3, the driving thin film transistor T2, the first electrode 710, the pixel defining layer 350, and the hole injection layer 721 are formed in the pixel area P of a substrate 110, and at the same time, the monitoring electrode 710d, the peripheral pixel defining layer 360, and the first sub-lower monitoring organic thin film 721d are formed in the peripheral area D of the substrate 110.

Figure 4:
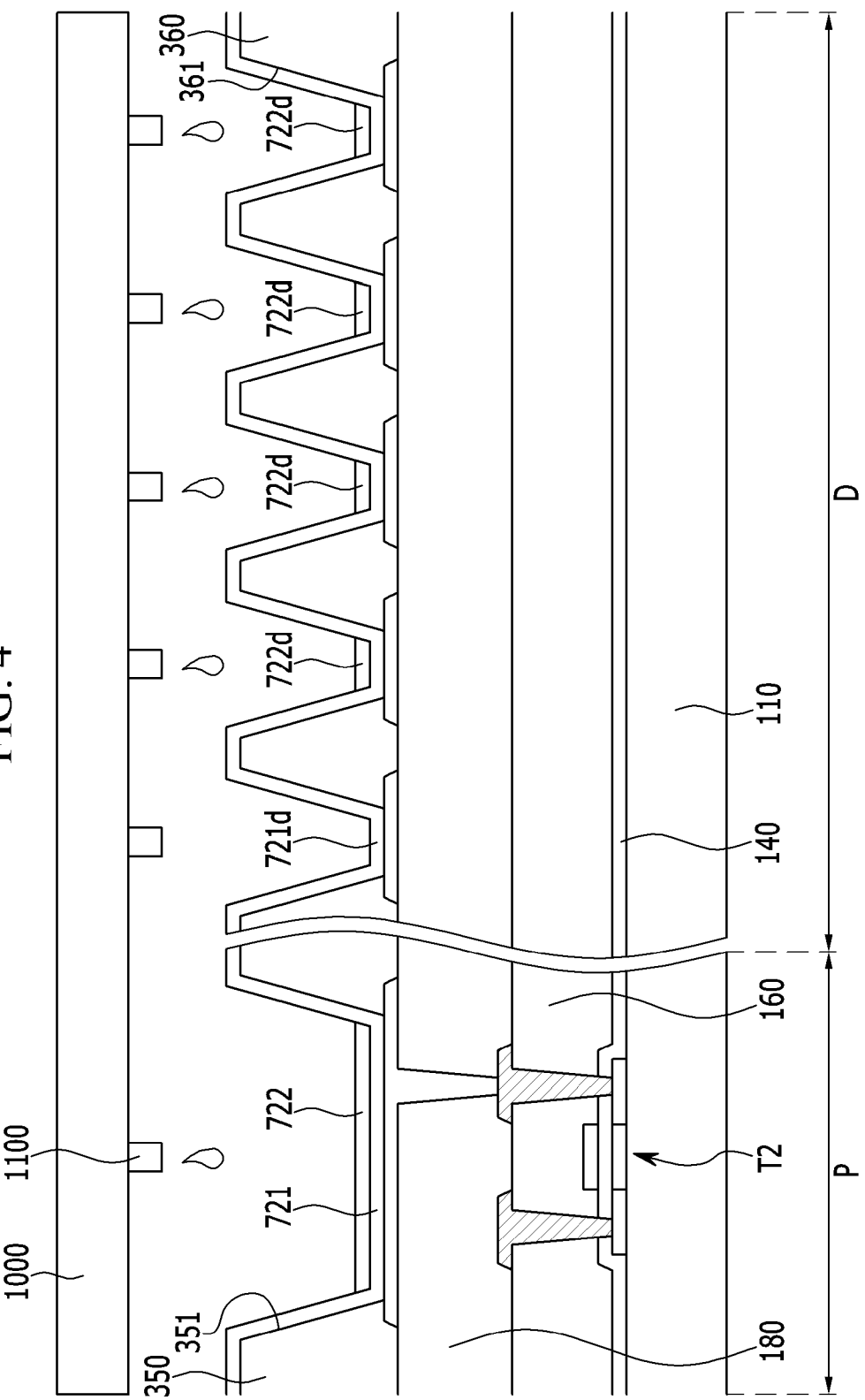

As shown in FIG. 4, the hole transport layer 722 and the second sub-lower monitoring organic thin film 722d are then simultaneously formed by a printing method using nozzles 1100 of a printing apparatus 1000.

Figure 5:
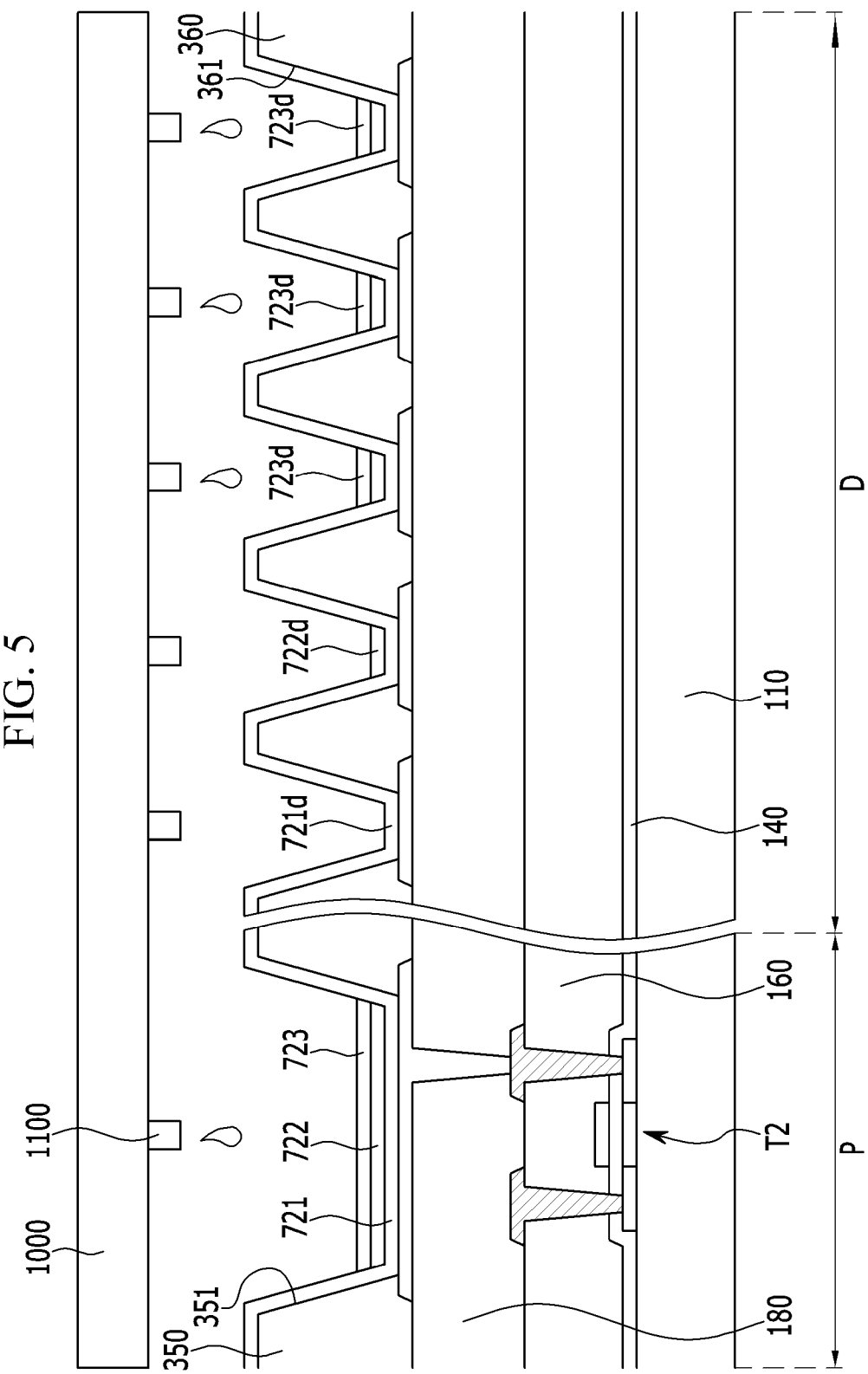

As shown in FIG. 5, the organic emissive layer 723 and the middle monitoring organic thin film 723d are then simultaneously formed using the nozzles 1100 of the printing apparatus 1000.

Figure 6:
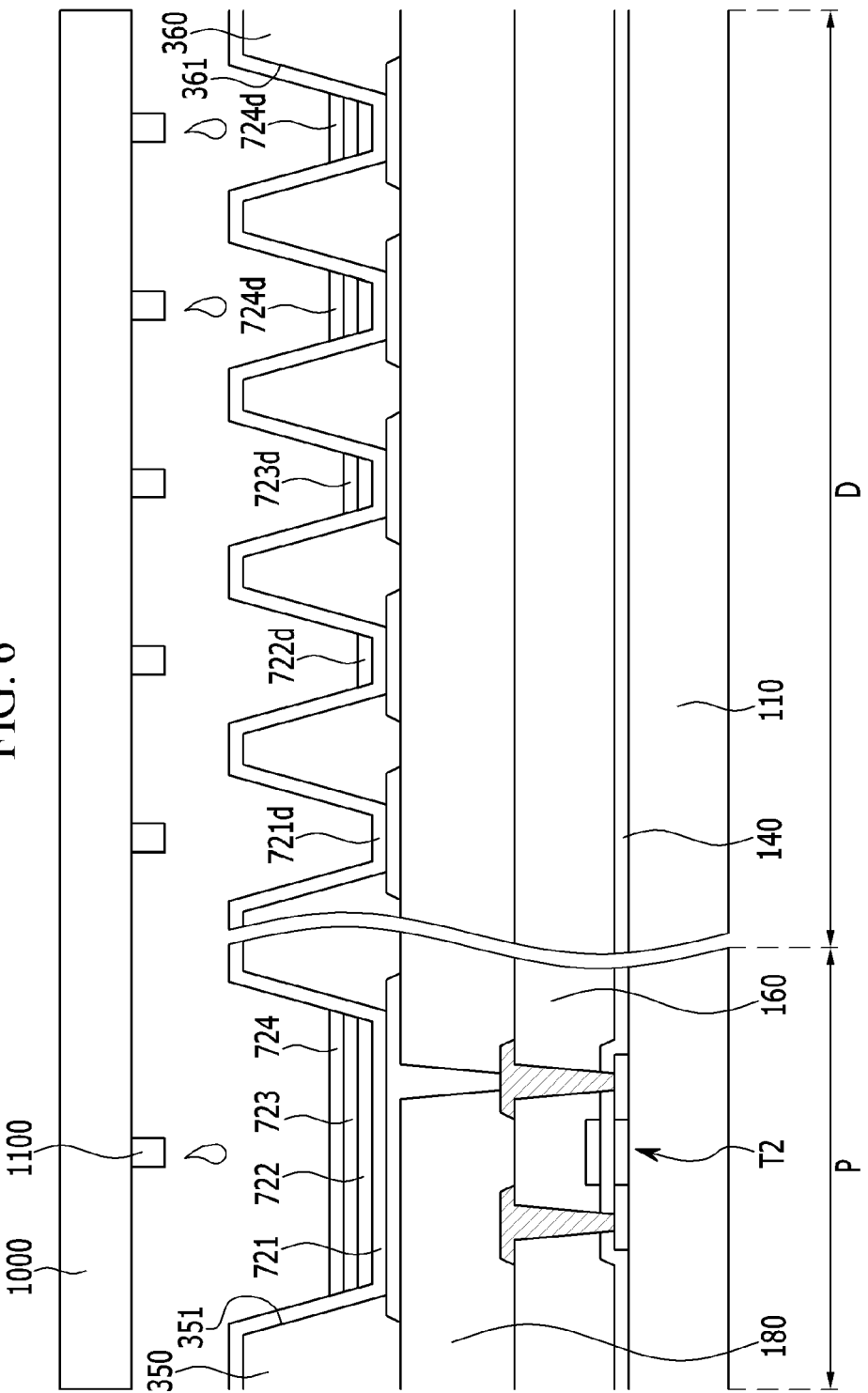

Then, as shown in FIG. 6, the electron transport layer 724 and the first sub-upper monitoring organic thin film 724d are simultaneously formed using the nozzles 1100 of the printing apparatus 1000.

Figure 7:
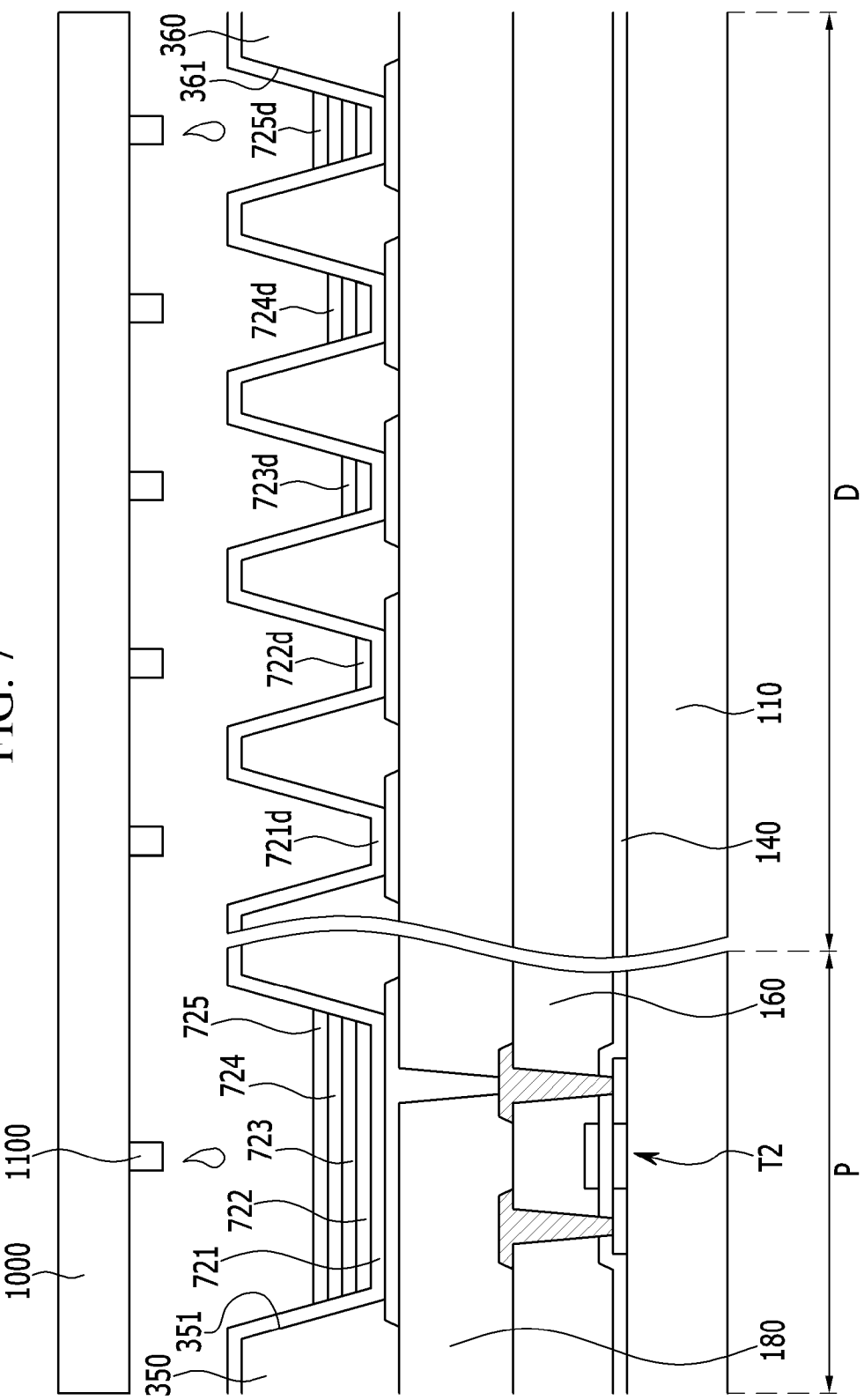

As shown in FIG. 7, the electron injection layer 725 and the second sub-upper monitoring organic thin film 725d are then simultaneously formed using the nozzles 1100 of the printing apparatus 1000.

Then, as shown in FIG. 2, the second electrode 730 and the reference monitoring electrode 730d are simultaneously formed in a front side such that the monitoring patterns 80, including the first lower monitoring pattern 81, the second lower monitoring pattern 82, the middle monitoring pattern 83, the first upper monitoring pattern 84, and the second upper monitoring pattern 85, are completed.

In addition, the monitoring patterns 81, 82, 83, 84, and 85 are compared with each other to measure the thickness of each of the organic thin films 722, 723, 724, and 725 forming the organic light emitting diode 70. For example, the thickness of the organic emission layer 723 can be measured using a height difference between the second lower monitoring pattern 82 and the middle monitoring pattern 83, or a height difference between the middle monitoring pattern 83 and the first upper monitoring pattern 84.

In an exemplary embodiment, the hole injection layer 721 is formed over the entire first electrode 710 and the pixel defining layer 350, and the first sub-lower monitoring organic thin film 721d is formed all over the monitoring electrode 710d and the peripheral pixel defining layer 360. However, the hole injection layer 721 may be formed in the opening 351 of the pixel defining layer 350 using the printing method, and the first sub-lower monitoring organic thin film 721d may be formed in the opening 361 of the peripheral pixel defining layer 360 using the printing method in another exemplary embodiment.

Figure 8:
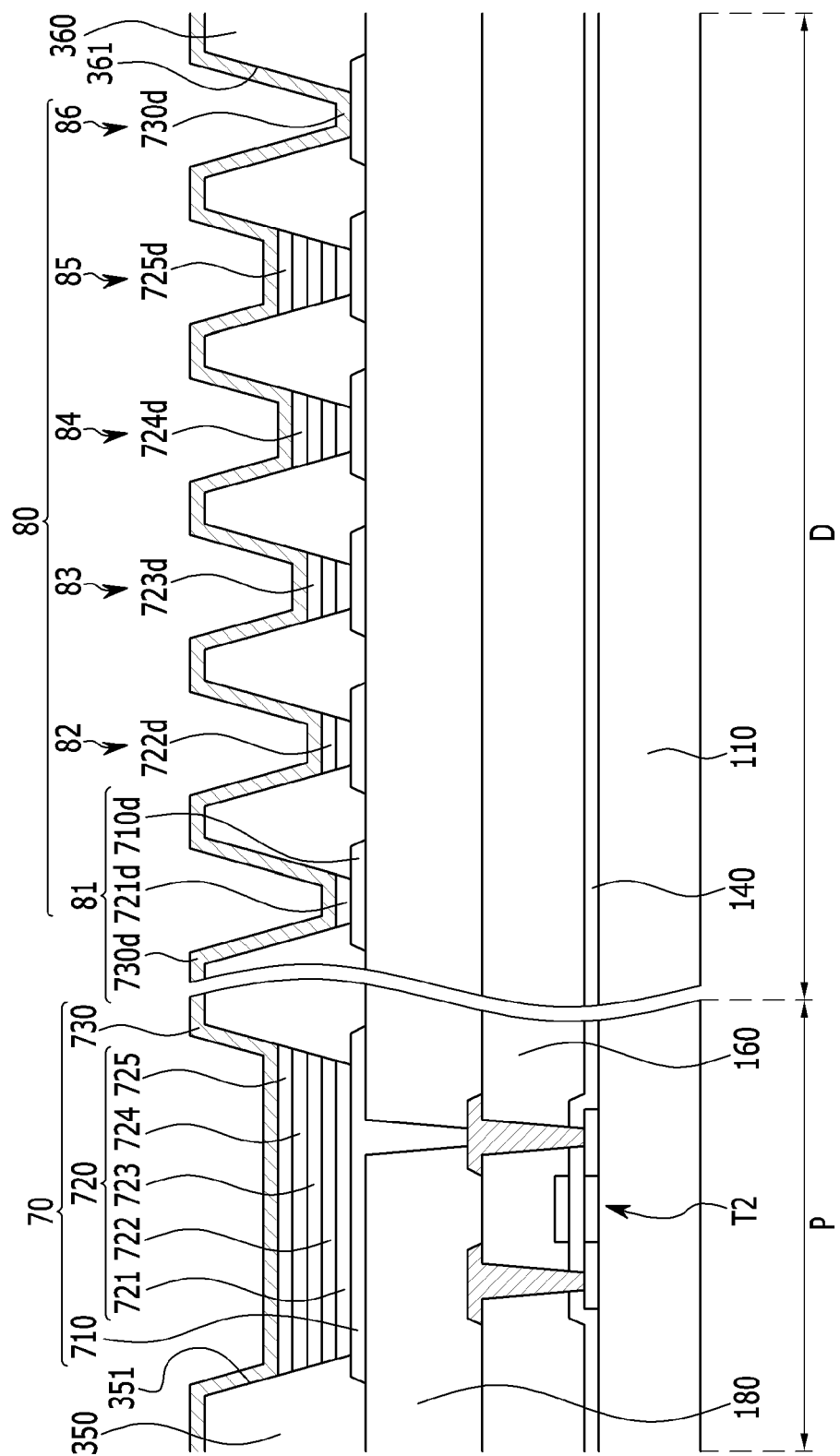
FIG. 8 is a cross-sectional view of an OLED display according to an exemplary embodiment of the present invention.

FIG. 8 is a cross-sectional view of an OLED display according to an exemplary embodiment of the present invention, and is substantially the same as the exemplary embodiment of FIG. 2, excluding a hole injection layer 721, and therefore, the same description will be omitted.

As shown in FIG. 8, the hole injection layer 721 is formed in an opening 351 of a pixel defining layer 350 using a printing method, and a first sub-lower monitoring organic thin film 721d is formed in an opening 361 of a peripheral pixel defining layer 360 using the printing method.

Monitoring patterns 80 may include lower monitoring patterns 81 and 82, a middle monitoring pattern 83, upper monitoring patterns 84 and 85, and a reference monitoring pattern 86.

The first lower monitoring pattern 81 includes a monitoring electrode 710d, a first sub-lower monitoring organic thin film 721d, and a reference monitoring electrode 730d. The second lower monitoring pattern 82 includes the monitoring electrode 710d, the first sub-lower monitoring organic thin film 721d, a second sub-lower monitoring organic thin film 722d, and the reference monitoring electrode 730d.

The middle monitoring pattern 83 includes the monitoring electrode 710d, the lower monitoring organic thin films 721d and 722d, the middle monitoring organic thin film 723d, and the reference monitoring electrode 730d. The lower monitoring organic thin films 721d and 722d, the middle monitoring organic thin film 723d, and the reference monitoring electrode 730d are sequentially layered.

The upper monitoring patterns 84 and 85 include a first upper monitoring pattern 84 and a second upper monitoring pattern 85. The first upper monitoring pattern 84 includes the monitoring electrode 710d, the lower monitoring organic thin films 721d and 722d, the middle monitoring organic thin film 723d, the first sub-upper monitoring organic thin film 724d, and the reference monitoring electrode 730d. The lower monitoring organic thin films 721d and 722d, the middle monitoring organic thin film 723d, the first sub-upper monitoring organic thin film 724d, and the reference monitoring electrode 730d are sequentially layered. In addition, the second upper monitoring pattern 85 includes the monitoring electrode 710d, the lower monitoring organic thin films 721d and 722d, the middle monitoring organic thin film 723d, the first sub-upper monitoring organic thin film 724d, the second sub-upper monitoring organic thin film 725d, and the reference monitoring electrode 730d. The lower monitoring organic thin films 721d and 722d, the middle monitoring organic thin film 723d, the first sub-upper monitoring organic thin film 724d, the second sub-upper monitoring organic thin film 725d, and the reference monitoring electrode 730d are sequentially layered.

The reference monitoring pattern 86 includes the reference monitoring electrode 730d made of the same material as the second electrode 730 and is formed on the same layer as the second electrode 730.

The number of monitoring patterns 80 is one greater than the number of organic thin films of which the thickness is to be measured. That is, the organic thin films forming the organic light emitting member of the OLED display according to an exemplary embodiment of the present invention are formed of five thin films of the hole injection layer 721, the hole transport layer 722, the organic emissive layer 723, the electron transport layer 724, and the electron injection layer 725, and therefore six monitoring patterns 81, 82, 83, 84, 85, and 86 may be formed to measure the thickness of the five organic thin films.

For example, the thickness of the hole injection layer 721 may be measured using a height difference between the reference monitoring pattern 86 and the first lower monitoring pattern 81.

As described, each of the organic thin films 721, 722, 723, 724, and 725 forming the organic light emitting member 720 forms the monitoring pattern 80 including at least one of the monitoring organic thin films 721d, 722, 723d, 724d, and 725d that are made of the same materials as the organic thin films 721, 722, 723, 724, and 725 on the same layer as the organic thin films 721, 722, 723, 724, and 725 such that the thickness and profile of each of the organic thin films 721, 722, 723, 724, and 725 can be precisely determined.

The OLED display and the manufacturing method thereof according to the exemplary embodiments of the present invention form monitoring patterns including at least one monitoring organic thin film that is made of the same material as each of organic thin films forming an organic light emitting member and formed on the same layer as the organic thin film so that the thickness and profile of each organic thin film can be precisely determined.

In addition, the monitoring patterns are formed using a printing method performed in an atmospheric pressure process so that the thickness and profile of each organic thin film can be quickly determined.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode (OLED) display comprising:
   a substrate comprising a pixel area and a peripheral area surrounding the pixel area;
   an organic light emitting diode disposed on the substrate in the pixel area, the organic light emitting diode comprising:
      a switching element disposed in the pixel area;
      a first electrode connected with the switching element;
      an organic light emitting member disposed on the first electrode and comprising organic thin films; and
      a second electrode disposed on the organic light emitting member; and
   monitoring patterns formed separate from each other and disposed in the peripheral area, each of the monitoring patterns comprising a reference monitoring electrode disposed at an uppermost portion in each of the monitoring patterns,
   wherein each of the reference monitoring electrodes is formed at a different height, respectively, above the substrate.

2. The OLED display of claim 1, wherein:
   the monitoring patterns further comprise a lower monitoring pattern, a middle monitoring pattern, and an upper monitoring pattern; and
   the organic thin films comprise a lower organic thin film, a middle organic thin film, and an upper organic thin film.

3. The OLED display of claim 2, wherein the lower monitoring pattern comprises a lower monitoring organic thin film made of the same material as a lowermost of the organic thin films.

4. The OLED display of claim 3, wherein the middle monitoring pattern comprises a lower monitoring organic thin film and a middle monitoring organic thin film respectively made of the same material as the lower and middle organic thin films.

5. The OLED display of claim 4, wherein the upper monitoring pattern comprises a lower monitoring organic thin film, a middle monitoring organic thin film, and an upper monitoring organic thin film respectively made of the same material as the lower, middle, and upper organic thin films.

6. The OLED display of claim 5, wherein the lower monitoring organic thin film comprises sub-lower monitoring organic thin films, and the upper monitoring organic thin film comprises sub-upper monitoring organic thin films.

7. The OLED display of claim 6, further comprising:
   a pixel defining layer disposed in the pixel area and comprising an opening that exposes the first electrode; and
   a peripheral pixel defining layer disposed in the peripheral area and separating the monitoring patterns,
   wherein the pixel defining layer and the peripheral pixel defining layer are made of the same material and are disposed on the same layer.

8. The OLED display of claim 7, wherein the lower organic thin film and the lower monitoring organic thin film entirely cover the pixel defining layer and the peripheral pixel defining layer, respectively.

9. The OLED display of claim 7, wherein the reference monitoring pattern comprises a reference monitoring electrode made of the same material as the second electrode, the reference monitoring electrode being disposed on the same layer as the second electrode.

10. The OLED display of claim 9, wherein the lower organic thin film and the lower monitoring organic thin film are respectively disposed in the opening of the pixel defining layer and an opening of the peripheral pixel defining layer.

11. The OLED display of claim 2, wherein the number of monitoring patterns is one greater than the number of organic thin films.

12. A method for manufacturing an organic light emitting diode (OLED) display, comprising:
   forming an organic light emitting diode in a pixel area of the substrate, and forming monitoring patterns in a peripheral area of the substrate, by depositing organic thin films; and
   measuring the thickness of each organic thin film by comparing the monitoring patterns with one another,
   wherein:
   each of the monitoring patterns comprises a reference monitoring electrode disposed at an uppermost portion in each of the monitoring patterns; and
   each of the reference monitoring electrodes is formed at a different height, respectively, above the substrate.

13. The method for manufacturing the OLED display of claim 12,
   wherein the forming of the light emitting member and the monitoring pattern are performed at the same time.

14. The method for manufacturing the OLED display of claim 13, wherein:
   the monitoring patterns comprise a lower monitoring pattern, a middle monitoring pattern, and an upper monitoring pattern; and
   the organic light emitting member comprises a lower organic thin film, a middle organic thin film, and an upper organic thin film.

15. The method for manufacturing the OLED display of claim 14, wherein:
   the lower monitoring pattern comprises a first lower monitoring pattern and a second lower monitoring pattern; and
   the upper monitoring pattern comprises a first upper monitoring pattern and a second upper monitoring pattern.

16. The method for manufacturing the OLED display of claim 15, wherein the lower monitoring pattern comprises a lower monitoring organic thin film made of the same material as the lower organic thin film.

17. The method for manufacturing the OLED display of claim 16, wherein the middle monitoring pattern comprises a lower monitoring organic thin film and a middle monitoring organic thin film respectively made of the same material as the lower and middle organic thin films.

18. The method for manufacturing the OLED display of claim 17, wherein the upper monitoring pattern comprises a lower monitoring organic thin film, a middle monitoring organic thin film, and an upper monitoring organic thin film respectively made of the same materials as the lower, middle, and upper organic thin films.

19. An organic light emitting diode (OLED) display comprising:
- a substrate comprising a pixel area and a peripheral area surrounding the pixel area;
- an organic light emitting diode disposed on the substrate in the pixel area; and
- monitoring patterns formed separate from each other and disposed in the peripheral area, wherein:
- the organic light emitting diode comprises an organic light emitting member comprising organic thin films in a layered arrangement;
- at least one of the monitoring patterns is made of the same material as one of the organic thin films;
- each of the monitoring patterns comprises a reference monitoring electrode disposed at an uppermost portion in each of the monitoring patterns; and
- each of the reference monitoring electrodes is formed at a different height, respectively, above the substrate.

* * * * *